United States Patent
Fu

(10) Patent No.: US 7,615,489 B1
(45) Date of Patent: Nov. 10, 2009

(54) METHOD FOR FORMING METAL INTERCONNECTS AND REDUCING METAL SEED LAYER OVERHANG

(75) Inventor: Xinyu Fu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/256,243

(22) Filed: Oct. 22, 2008

(51) Int. Cl.
*H01L 23/522* (2006.01)
(52) U.S. Cl. ............... 438/674; 438/618; 257/E21.575
(58) Field of Classification Search .......... 438/618, 438/622, 625, 627, 628, 674, 676, 685; 257/E21.575, 257/E21.577, E21.584, E21.586

See application file for complete search history.

(56) References Cited

U.S. PATENT DOCUMENTS 6,117,781 A * 9/2000 Lukanc et al. .............. 438/692
2006/0258142 A1 * 11/2006 Haider et al. .............. 438/618

* cited by examiner

*Primary Examiner*—Matthew Smith
*Assistant Examiner*—Michele Fan
(74) *Attorney, Agent, or Firm*—Patterson & Sheridan, LLP

(57) ABSTRACT

A method for forming metal interconnects on a substrate is described. A substrate with a dielectric layer is positioned within a processing chamber. A first barrier layer is deposited on the dielectric layer and within a plurality of vias of the dielectric layer, wherein the first barrier layer includes beveled edges extending from a field of the substrate to a sidewall surface of each via. The first barrier layer and the dielectric layer are etched to form a recess at each beveled edge. A second barrier layer is deposited over the recess. A metal seed layer deposited over the first barrier layer, the second barrier layer, and within the recess.

24 Claims, 4 Drawing Sheets

METHOD FOR FORMING METAL INTERCONNECTS AND REDUCING METAL SEED LAYER OVERHANG

BACKGROUND OF THE INVENTION

1. Field of the Invention

Embodiments of the invention generally relate to sputtering processes, and more specifically, to sputtering processes for forming of metal interconnects in integrated circuits.

2. Description of the Related Art

Sputtering, alternatively called physical vapor deposition (PVD), is a prevalent method for depositing layers of metals and related materials in the fabrication of integrated circuits. Although originally sputtering was principally used to deposit substantially planar films for horizontal interconnects, more recent techniques have been developed to coat thin, conformal metal or metal nitride layers in holes formed within a dielectric layer. Such holes may be very narrow vias penetrating the dielectric layer which may be filled with a conductive material to provide vertical electrical interconnections between wiring layers.

Sputtering technology faces increasing challenges as the feature size of advanced integrated circuits continues to decrease. Sputtering is basically a process ill suited to coat the walls of high aspect-ratio holes. A typical via structure is illustrated in the cross-sectional view of FIG. 1. A lower dielectric layer 10 on a substrate 90 includes a conductive feature 12 formed within. An upper dielectric layer 14 is deposited over the lower dielectric layer 10 and conductive feature 12. A via hole 16 may be etched through the upper dielectric layer 14 overlying the conductive feature. In one example, the thickness of the dielectric layer 14 may be about 1 μm, while the width of the via hole 16 may be about 0.13 μm or less, such as about 65 nm. As a result, the via holes 16 have increasing aspect ratios, hence present some of the greatest challenges.

A barrier layer 18 may be deposited onto the sidewalls of the via hole 16 and on the planar field region on the top of the dielectric layer 14. The barrier layer 18 prevents diffusion between the dielectric layer 14 and metal which will be subsequently filled into the via hole 16. A metal seed layer 20 is then deposited on the barrier layer 18. The seed layer 20 may be composed of copper, tungsten, aluminum, ruthenium, or cobalt.

However, sputtering tends to create overhangs 28 in the seed layer 20 on the upper corner of the hole 16. Such overhangs 28 may introduce serious problems. The overhangs 28 progressively grow and narrow the passageway of the via hole 16 during the sputter deposition, thus effectively increasing the aspect ratio and further decreasing the sputter flux into the hole 16. Even for an electrochemical plating (ECP) fill, the overhangs 28 present an impediment to the flow of fresh electrolyte. In a worst case, the overhangs 28 can bridge and enclose the via hole 16 and prevent further deposition into the hole 16.

For the forgoing reasons, there is a need for improving the sputter deposition so as to prevent overhanging of the seed layer within the vias on a substrate surface.

SUMMARY OF THE INVENTION

According to embodiments of the invention, a method for forming metal interconnects on a substrate surface is provided which includes depositing a first barrier layer on a dielectric layer of a substrate and within a plurality of vias disposed within the first dielectric layer, wherein the first barrier layer includes beveled edges extending from a field of the substrate to a sidewall surface of each via. The method further provides etching the first barrier layer and the dielectric layer to form a recess at each beveled edge, so that the recess extends through the first barrier layer and into the dielectric layer, depositing a second barrier layer over the recess, and depositing a metal seed layer over the first barrier layer, the second barrier layer, and within the recess.

In one embodiment, a method for forming metal interconnects on a substrate surface is provided which includes depositing a first barrier layer on a substrate during a first physical vapor deposition (PVD) process, wherein the first barrier layer contains beveled edges extending from a field of the substrate to a sidewall surface of vias formed within a dielectric layer disposed on the substrate, etching the first barrier layer and the dielectric layer to form a recess at each beveled edge, wherein the recess extends through the first barrier layer and into the dielectric layer, depositing a second barrier layer over the recess during a second PVD process, and depositing a metal seed layer over the first barrier layer, the second barrier layer, and within the recess.

In one embodiment, the method further provides forming the bevels in the first barrier layer by adjusting a plasma bias during the first PVD process. In one example, the plasma bias forms an induced substrate bias across the substrate while forming the bevels in the first barrier layer. The induced substrate bias may be within a range from about 70 volts to about 120 volts during the physical vapor deposition process. The first barrier layer may be deposited thicker along the field of the substrate than along the beveled edge. The first barrier layer and the second barrier layer may independently contain titanium, tantalum, tungsten, nitrides thereof, silicides thereof, alloys thereof, and combinations thereof. In some examples, the barrier layer has multiple layers or a bi-layer of tantalum and tantalum nitride, titanium and titanium nitride, or tungsten and tungsten nitride.

In another embodiment, the method further provides forming recesses at each beveled edge by exposing the substrate exposed to a plasma. The plasma forms an induced substrate bias across the substrate during etching process. The induced substrate bias may be within a range from about 250 volts to about 400 volts while etching the first barrier layer and the dielectric layer.

Embodiments provide a method for depositing a metal seed layer within a recess formed on the beveled edges of the vias. The metal seed layer is formed without overhang or substantially overhanging into the vias. Subsequently, a bulk layer may be deposited over the metal seed layer to fill the vias free of voids with a conductive material. The metal seed layer may contain copper, tungsten, aluminum, ruthenium, cobalt, silver, alloys thereof, or combinations thereof. The conductive material may be copper, tungsten, aluminum, alloys thereof, derivatives thereof, or combinations thereof.

In another embodiment, a method for forming metal interconnects on a substrate surface is provided which includes adjusting a plasma bias to form beveled edges of a first barrier layer while depositing the first barrier layer over a plurality of vias contained within a dielectric layer disposed on a substrate during a first PVD process. The beveled edges extend from a field of the substrate to sidewall surfaces of the vias. The method further includes forming a recess feature at each beveled edge by etching through the first barrier layer and into the dielectric layer, and depositing a metal seed layer within the recess, such that the metal seed layer is deposited with no overhang or substantially no overhang within the vias. In one example, the method further includes depositing a second barrier layer within the recess during a second PVD process prior to depositing the metal seed layer, wherein the metal seed layer is deposited over the second barrier layer. Subsequently, a bulk layer may be deposited over the metal seed layer to fill the vias free of voids with a bulk material.

In another embodiment, a method for forming metal interconnects on a substrate surface is provided which includes adjusting a plasma bias to etch recesses within a dielectric layer while depositing a barrier layer with beveled edges around each of the recesses and over a plurality of vias contained within the dielectric layer disposed on a substrate during a PVD process, wherein the beveled edges extend from a field of the substrate to sidewall surfaces of the vias, and depositing a metal seed layer within the recesses, wherein the metal seed layer is deposited with no overhang or substantially no overhang within the vias.

In another embodiment, a metal interconnect is provided which includes a plurality of vias formed within a dielectric layer disposed on a substrate, wherein each via has beveled edges extending from a field of the substrate to a sidewall surface of each via, a recess extending into the dielectric layer at the beveled edges of each via, a first barrier layer disposed over the dielectric layer and is discontinuous along the beveled edges at each recess, a second barrier layer disposed over the first barrier layer, the beveled edges, and an exposed surfaces of the dielectric layer, and within the recess and the vias, and a metal seed layer disposed over the second barrier layer and within the recesses.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
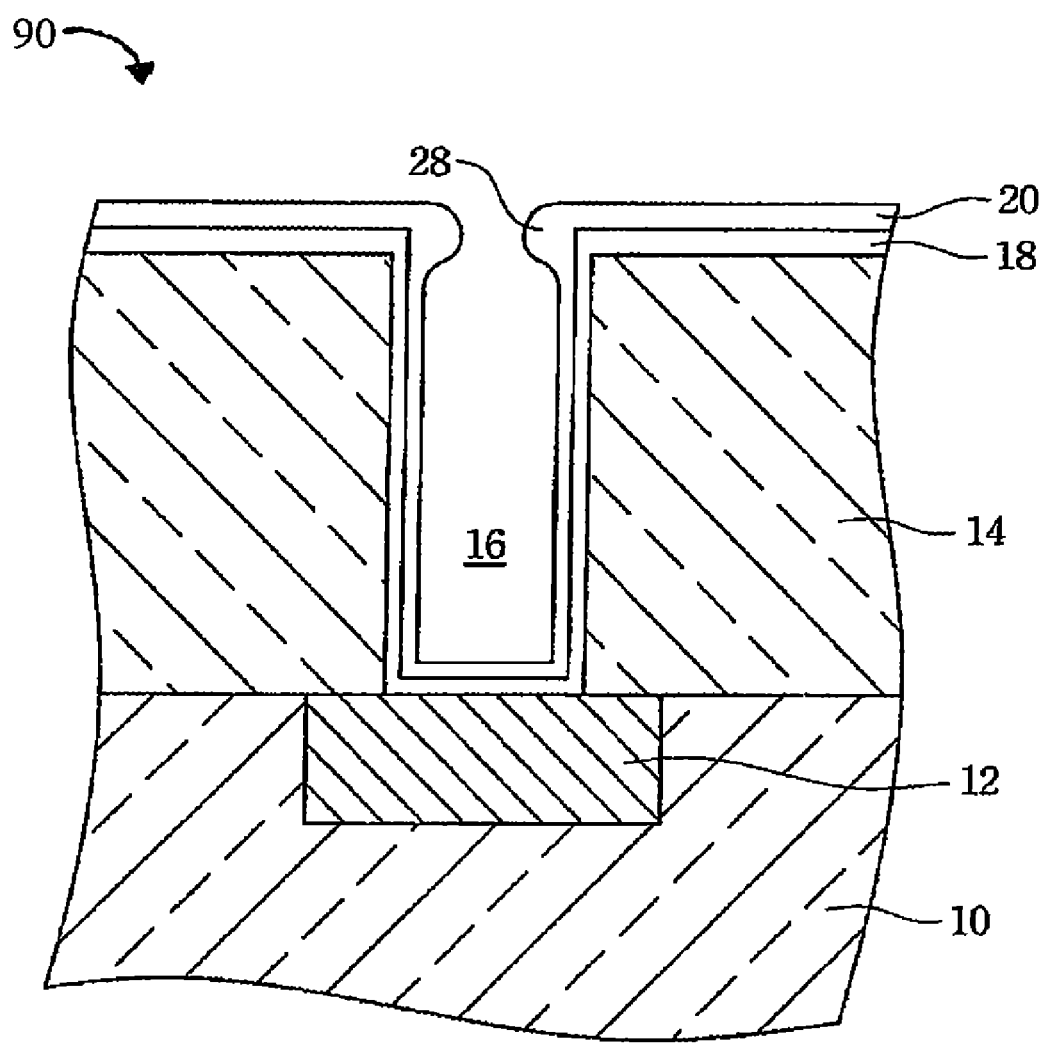
FIG. 1 illustrates a cross-sectional view of a via hole having overhangs forming at the top of the via hole, as described in the prior art.

Embodiments of the invention are generally directed to a method for forming metal interconnects on a substrate within a processing chamber and preventing seed layer overhangs formed at the upper corner of the via holes during a physical vapor deposition (PVD) process.

FIGS. 2A-2F illustrate a series of cross-sectional views of a substrate 190 while forming metal interconnects thereon, according to one embodiment of invention. Referring FIG. 2A, a lower dielectric layer 100 on substrate 190 contains a conductive feature 102 formed within. The lower dielectric layer 100 may contain dielectric material such as silicon, silicon dioxide, doped silica, and other types of low-k materials. The conductive feature 102 may be usually part of a lower wiring layer. The conductive feature 102 may contain a conductive material, such as copper, tungsten, aluminum, alloys thereof, or derivatives thereof. A lower dielectric layer 100 may alternatively contain a crystalline silicon, in which case the conductive feature 102 may be a doped contact region containing silicon or a silicide electrode.

An upper dielectric layer 104 may be deposited over the lower dielectric layer 100 and conductive feature 102. A via hole 106 may be etched through the upper dielectric layer 104 to expose the surface of the conductive feature 102.

Figure 2A:
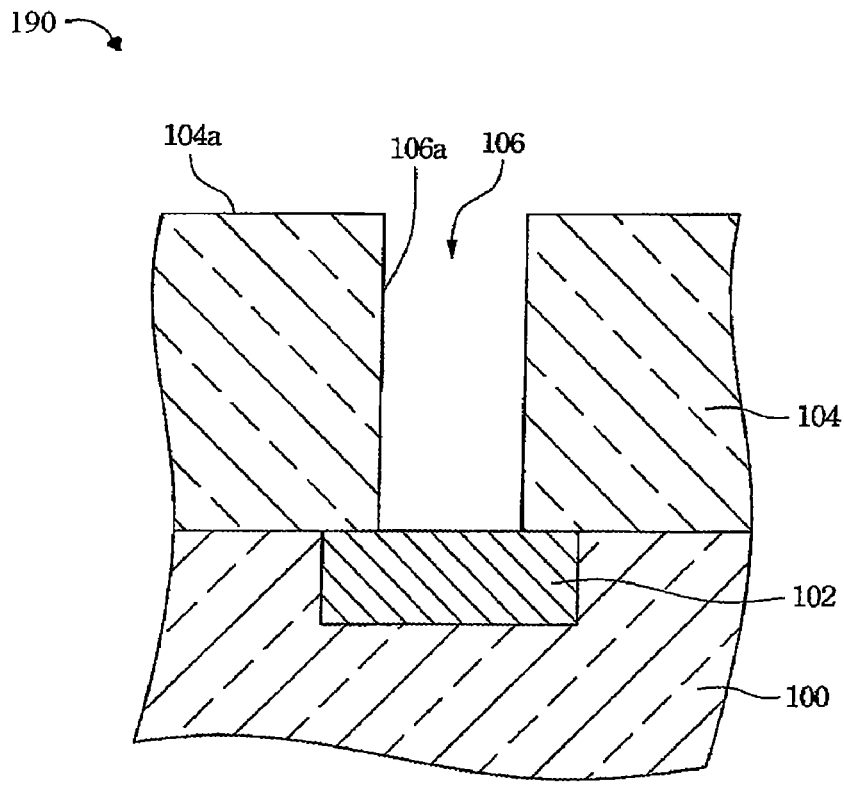
FIGS. 2A-2F illustrate a series of cross-sectional views of forming metal interconnects on a substrate according to one embodiment of invention.
Figure 2B:
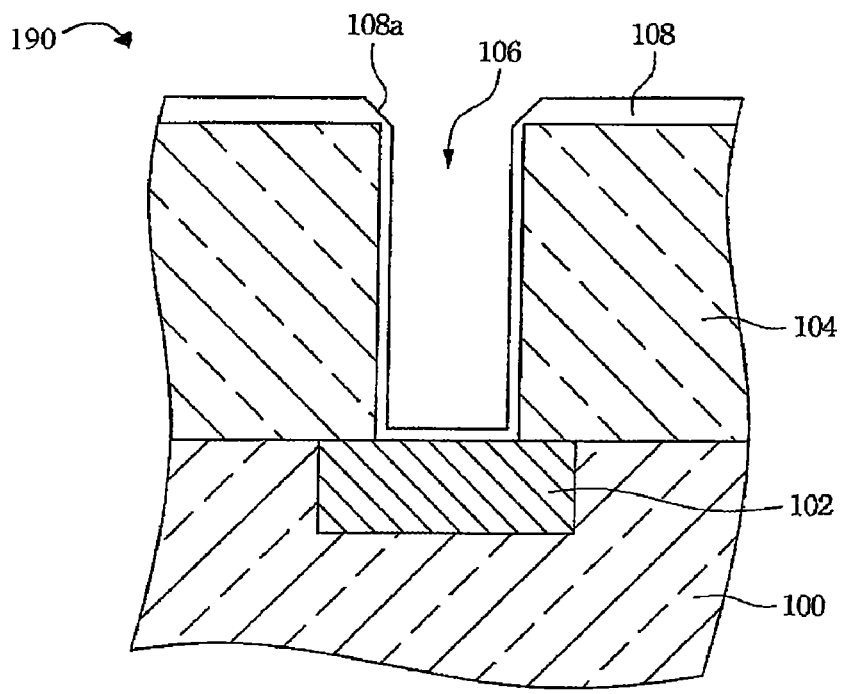

Referring to both FIGS. 2A-2B, a first barrier layer 108 is deposited onto the sidewall surface 106a of the via hole 106, on the field 104a on the top of the upper dielectric layer 104 and on the surface of the conductive feature 102. Beveled edges 108a are particularly formed at the upper corner of the via hole 106 extending from a field 104a of the substrate to a sidewall surface 106a of the via hole 106. The first barrier layer 108 has a beveled edge 108a which is substantially right-angled at the upper corner of the via hole 106. The first barrier layer 108 is deposited thinner along the beveled edge 108a than along the field 104a of the substrate and along the sidewall surface 106a of the via hole 106. The first barrier layer 108 may contain a material such as titanium, tantalum, tungsten, nitrides thereof, silicides thereof, alloys thereof, derivatives thereof, or combination thereof. In some examples, the first barrier layer 108 may also be a bi-layer of tantalum and tantalum nitride, tungsten and tungsten nitride, or titanium and titanium nitride. The barrier layer 108 may be deposited by one or several PVD processes. The beveled edges 108a may be formed by adjusting a plasma bias during the PVD process. The plasma bias may have a power setting to form an induced substrate bias while forming the beveled edges 108a. In one example, the induced substrate bias may be within a range from about 70 volts to about 120 volts.

Figure 2C:
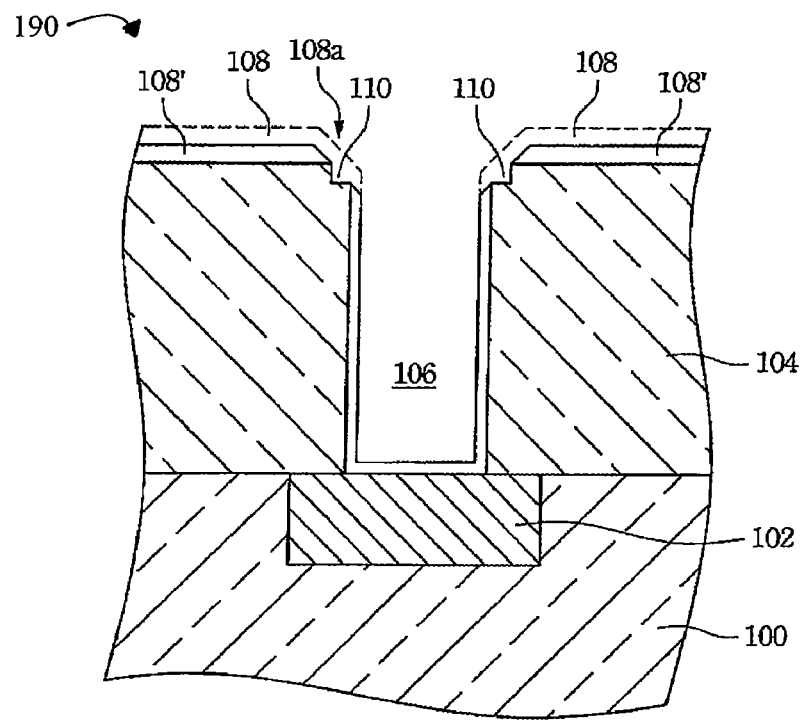

Referring to FIG. 2C, an etching process is executed to diminish thickness of the first barrier layer 108 to form a thinner first barrier layer 108'. Since the etch rate is similar along all surfaces of the first barrier layer 108, the first barrier layer 108' at the upper corner of the via hole 106 is etched through first. Since the etch rate is higher on the upper dielectric materials than on conductive materials of the first barrier layer 108, the subsequent etch will form a substantially step shape recess 110 at the beveled edge 108a. In this embodiment, an etching plasma may be used to remove a portion of the material from the first barrier layer 108. The etching plasma may contain a gas such as argon, helium, nitrogen, neon, or combinations thereof. The plasma bias may have a power setting to form an induced substrate bias while etching the recess 110. In one example, the induced substrate bias may be within a range from about 250 volts to about 400 volts.

Figure 2D:
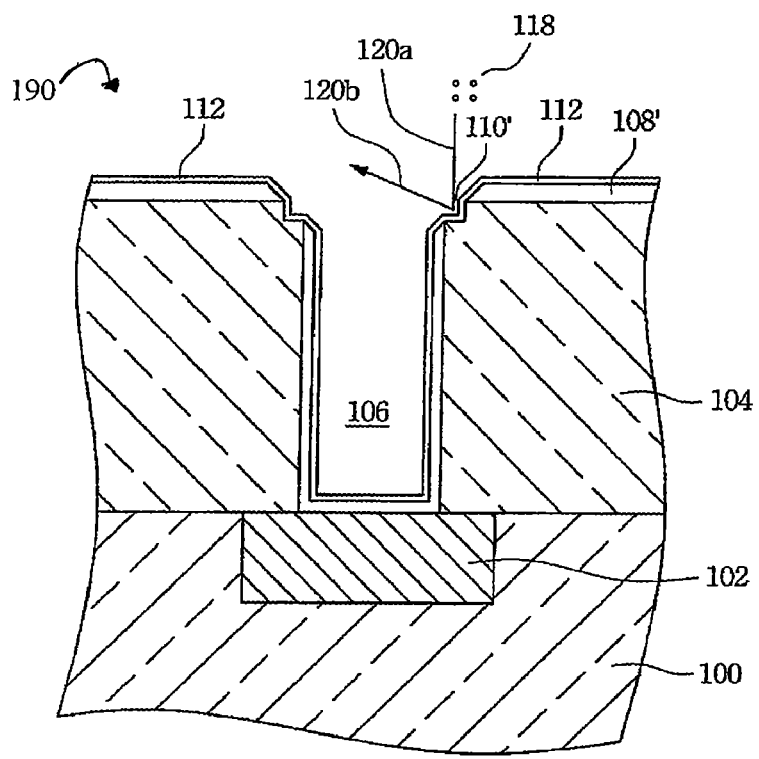

Referring to FIG. 2D, a second barrier layer 112 is deposited to at least cover the recess 110, or cover the recess 110 and the first barrier layer 108' by a flash PVD process. In one embodiment, the second barrier layer 112 may be thin enough so that the second barrier layer 112 still has a conformal step shape of recess 110' at the upper corner (or beveled edge) of the via hole 106. The second barrier layer 112 may be the same or different materials as the first barrier layer 108. The second barrier layer 112 may contain a material such as titanium, tantalum, tungsten, nitrides thereof, silicides thereof, alloys thereof, derivatives thereof or combination thereof.

The first barrier layer 108 and the second barrier layer 112 are to prevent diffusion between the dielectric and the metal filled into the hole. Metal diffusing into the dielectric may create a short. Oxygen diffusing into the metallization degrades the metallic conductivity. The first barrier layer 108 and the second barrier layer 112 also act as an adhesion layer to the dielectric, particularly for copper which does not wet well onto silica.

Figure 2E:
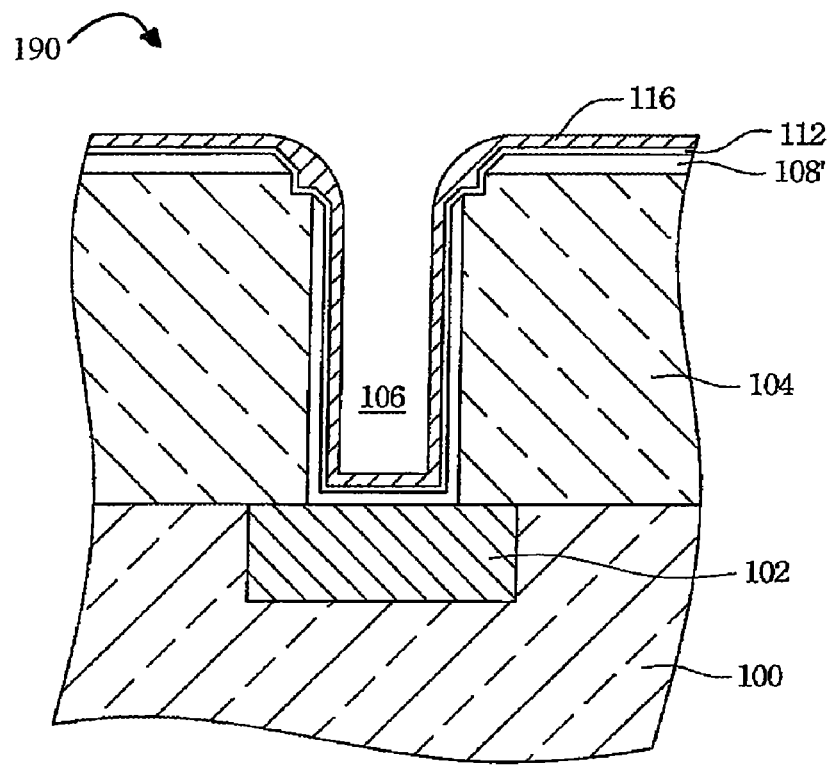

Referring to both FIG. 2D and FIG. 2E, a metal seed layer 116 is deposited over the first barrier layer 108', the second barrier layer 112 and within the via hole 106. The seed layer overhang formed during a conventional sputter deposition is effectively reduced because of the step shape recess 110' at the upper corner (or beveled edge) of the via hole 106. The recess 110' feature is effective for reducing the overhang problem because of (1) "absorbing" the bevel overhang resulting from a direct metal seed deposition 118 along the direction 120a into the recess 110' and (2) "lifting up" the emission direction 120b of the reflected metal seed deposition, so that much less metal seed deposition goes to the opposite bevel edge.

The metal seed layer 116 may contain the same metal used for the metallization fill or a different metal. In one example, a copper seed layer may be deposited for a copper metallization, and in another example, an aluminum seed layer may be deposited for an aluminum metallization. The metal seed layer 116 may contain a material such as copper, tungsten, aluminum, ruthenium, cobalt, silver, alloys thereof, or combinations thereof.

Figure 2F:
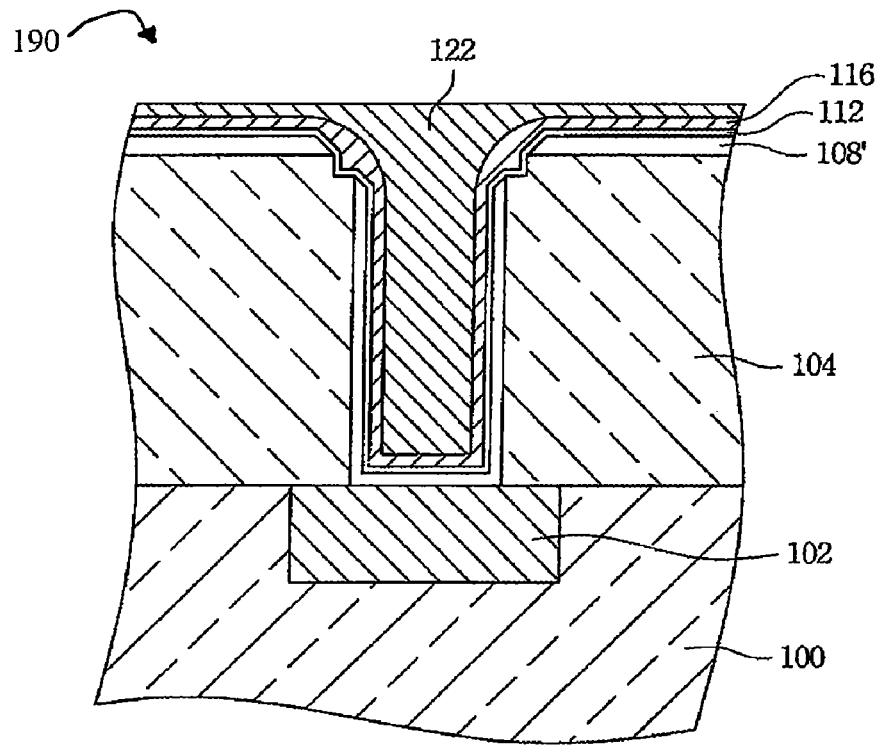

Referring to FIG. 2F, the metallization metal 122 is filled into the via hole 106 over the metal seed layer 116. In one example, an electrochemical plating (ECP) process may be used to fill the via hole 106 during a copper metallization process. The metal seed layer 116 serves as a nucleation layer for the copper and serves as the plating electrode during the ECP process. In other examples, a PVD process, a CVD process, or an electroless process may be used to fill the via hole 106. The metallization metal 122 may contain conductive materials such as copper, tungsten, aluminum, alloys thereof, or combinations thereof. After the metallization metal 122 is filled into the via hole 106, chemical mechanical polishing (CMP) may be performed to remove the excess metal materials (e.g., copper).

In one embodiment, a method for forming metal interconnects on a substrate surface is provided which includes depositing a first barrier layer on a dielectric layer of a substrate and within a plurality of vias disposed within the first dielectric layer. The first barrier layer includes beveled edges extending from a field of the substrate to a sidewall surface of each via. The method further provides etching the first barrier layer and the dielectric layer to form a recess at each beveled edge, so that the recess extends through the first barrier layer and into the dielectric layer. The method further provides depositing a second barrier layer over the recess, and depositing a metal seed layer over the first barrier layer, the second barrier layer, and within the recess.

In one embodiment, a method for forming metal interconnects on a substrate surface is provided which includes depositing a first barrier layer on a substrate during a first physical vapor deposition (PVD) process, wherein the first barrier layer contains beveled edges extending from a field of the substrate to a sidewall surface of vias formed within a dielectric layer disposed on the substrate, etching the first barrier layer and the dielectric layer to form a recess at each beveled edge, wherein the recess extends through the first barrier layer and into the dielectric layer, depositing a second barrier layer over the recess during a second PVD process, and depositing a metal seed layer over the first barrier layer, the second barrier layer, and within the recess.

In one embodiment, the method further provides forming the bevels in the first barrier layer by adjusting a plasma bias during the first PVD process. In one example, the plasma bias forms an induced substrate bias across the substrate while forming the bevels in the first barrier layer. The induced substrate bias may be within a range from about 70 volts to about 120 volts during the physical vapor deposition process. The first barrier layer may be deposited thicker along the field of the substrate than along the beveled edge. The first barrier layer and the second barrier layer may independently contain titanium, tantalum, tungsten, nitrides thereof, silicides thereof, alloys thereof, and combinations thereof. In some examples, the barrier layer has multiple layers or a bi-layer of tantalum and tantalum nitride, titanium and titanium nitride, or tungsten and tungsten nitride.

In another embodiment, the method further provides forming recesses at each beveled edge by exposing the substrate exposed to a plasma. The plasma forms an induced substrate bias across the substrate during etching process. The induced substrate bias may be within a range from about 250 volts to about 400 volts while etching the first barrier layer and the dielectric layer.

Embodiments provide a method for depositing a metal seed layer within a recess formed on the beveled edges of the vias. The metal seed layer is formed without overhang or substantially overhanging into the vias. Subsequently, a bulk layer may be deposited over the metal seed layer to fill the vias free of voids with a conductive material. The metal seed layer may contain copper, tungsten, aluminum, ruthenium, cobalt, silver, alloys thereof, or combinations thereof. The conductive material may be copper, tungsten, aluminum, alloys thereof, derivatives thereof, or combinations thereof.

In another embodiment, a method for forming metal interconnects on a substrate surface is provided which includes adjusting a plasma bias to form beveled edges of a first barrier layer while depositing the first barrier layer over a plurality of vias contained within a dielectric layer disposed on a substrate during a first PVD process. The beveled edges extend from a field of the substrate to sidewall surfaces of the vias. The method further includes forming a recess feature at each beveled edge by etching through the first barrier layer and into the dielectric layer, and depositing a metal seed layer within the recess, such that the metal seed layer is deposited with no overhang or substantially no overhang within the vias. In one example, the method further includes depositing a second barrier layer within the recess during a second PVD process prior to depositing the metal seed layer, wherein the metal seed layer is deposited over the second barrier layer. Subsequently, a bulk layer may be deposited over the metal seed layer to fill the vias free of voids with a conductive material.

In another embodiment, a method for forming metal interconnects on a substrate surface is provided which includes adjusting a plasma bias to etch recesses within a dielectric layer while depositing a barrier layer with beveled edges around each of the recesses and over a plurality of vias contained within the dielectric layer disposed on a substrate during a PVD process, wherein the beveled edges extend from a field of the substrate to sidewall surfaces of the vias, and depositing a metal seed layer within the recesses, wherein the metal seed layer is deposited with no overhang or substantially no overhang within the vias.

Although the discussed embodiments only illustrate via holes penetrating the dielectric layer to provide vertical electrical interconnections between wiring layers, the improved method for forming metal interconnects also applies to narrow trenches formed in the surface of the dielectric layer to provide horizontal electrical interconnections in the upper wiring layer, or narrow trenches formed in silicon to form trench capacitors for which a thin dielectric layer and an inner electrode need to be coated into the trench.

According to the forgoing embodiments, the improved method for forming metal interconnects utilizes "step shape recess" features at the beveled edge of the via hole to "absorb" the direct metal deposition and "lift up" the emission direction of the reflected metal deposition to reduce deposition on the opposite beveled edge such that the metal seed layer overhang formed at the upper corner of the via hole can be effectively reduced.

While the foregoing is directed to embodiments of the invention, other and further embodiments of the invention may be devised without departing from the basic scope thereof, and the scope thereof is determined by the claims that follow.

The invention claimed is:

1. A method for forming metal interconnects on a substrate surface, comprising:
    depositing a first barrier layer on a substrate and over the surfaces of a plurality of vias disposed within a dielectric layer on the substrate, wherein the first barrier layer comprises beveled edges extending from a field of the substrate to a sidewall surface of each via;
    etching the first barrier layer and the dielectric layer to form a recess at each beveled edge, wherein the recess extends through the first barrier layer and into the dielectric layer;
    depositing a second barrier layer over the recess; and
    depositing a metal seed layer over the first barrier layer, the second barrier layer, and within the recess.

2. The method of claim 1, wherein the first barrier layer is deposited by a physical vapor deposition process and the beveled edge is formed by adjusting a plasma bias.

3. The method of claim 2, wherein the plasma bias forms an induced substrate bias across the substrate, and the induced substrate bias is within a range from about 70 volts to about 120 volts during the physical vapor deposition process.

4. The method of claim 1, wherein the first barrier layer is deposited thicker along the field of the substrate than along the beveled edge.

5. The method of claim 1, wherein the first barrier layer comprises a material selected from the group consisting of titanium, tantalum, tungsten, nitrides thereof, silicides thereof, alloys thereof, and combinations thereof.

6. The method of claim 5, wherein the first barrier layer comprises a bi-layer of tantalum and tantalum nitride, titanium and titanium nitride, or tungsten and tungsten nitride.

7. The method of claim 1, wherein the second barrier layer is deposited by a physical vapor deposition process.

8. The method of claim 7, wherein the second barrier layer is also deposited on the first barrier layer.

9. The method of claim 1, wherein the second barrier layer comprises a material selected from the group consisting of titanium, tantalum, tungsten, nitrides thereof, silicides thereof, alloys thereof, derivatives thereof and combinations thereof.

10. The method of claim 1, wherein the metal seed layer comprises a material selected from the group consisting of copper, tungsten, aluminum, ruthenium, cobalt, silver, alloys thereof, and combinations thereof.

11. The method of claim 10, further comprising filling the vias with a conductive material during a deposition process.

12. The method of claim 11, wherein the conductive material is selected from the group consisting of copper, tungsten, aluminum, alloys thereof, and combinations thereof.

13. The method of claim 1, wherein the substrate is exposed to a plasma to form the recess at each beveled edge, the plasma forms an induced substrate bias across the substrate within a range from about 250 volts to about 400 volts while etching the first barrier layer and the dielectric layer.

14. A method for forming metal interconnects on a substrate surface, comprising:
    depositing a first barrier layer on a substrate during a first physical vapor deposition process, wherein the first barrier layer comprises beveled edges extending from a field of the substrate to a sidewall surface of vias formed within a dielectric layer disposed on the substrate;
    etching the first barrier layer and the dielectric layer to form a recess at each beveled edge, wherein the recess extends through the first barrier layer and into the dielectric layer;
    depositing a second barrier layer over the recess during a second physical vapor deposition process; and
    depositing a metal seed layer over the first barrier layer, the second barrier layer, and within the recess and the vias.

15. The method of claim 14, wherein the first barrier layer is formed by adjusting a plasma bias during the first physical vapor deposition process.

16. The method of claim 14, wherein the plasma bias forms an induced substrate bias across the substrate, and the induced substrate bias is within a range from about 70 volts to about 120 volts during the physical vapor deposition process.

17. The method of claim 14, wherein the first barrier layer is deposited thicker along the field of the substrate than along the beveled edge.

18. The method of claim 14, wherein each of the first barrier layer and the second barrier layer independently comprises a material selected from the group consisting of titanium, tantalum, tungsten, nitrides thereof, silicides thereof, alloys thereof, and combinations thereof.

19. The method of claim 14, wherein the metal seed layer comprises a material selected from the group consisting of copper, tungsten, aluminum, ruthenium, cobalt, silver, alloys thereof, and combinations thereof.

20. The method of claim 19, further comprising filling the vias with a conductive material during a deposition process, and the conductive material is selected from the group consisting of copper, tungsten, aluminum, alloys thereof, and combinations thereof.

21. The method of claim 14, wherein the substrate is exposed to a plasma to form the recess at each beveled edge, the plasma forms an induced substrate bias across the substrate within a range from about 250 volts to about 400 volts while etching the first barrier layer and the dielectric layer.

22. A method for forming metal interconnects on a substrate surface, comprising:
    adjusting a plasma bias to form beveled edges of a first barrier layer while depositing the first barrier layer over a plurality of vias contained within a dielectric layer disposed on a substrate during a first physical vapor deposition process, wherein the beveled edges extend from a field of the substrate to sidewall surfaces of the vias;
    forming a recess feature at each beveled edge by etching through the first barrier layer and into the dielectric layer; and
    depositing a metal seed layer within the recess, wherein the metal seed layer is deposited with no overhang or substantially no overhang within the vias.

23. The method of claim 22, further comprising depositing a second barrier layer within the recess during a second physical vapor deposition process prior to depositing the metal seed layer, wherein the metal seed layer is deposited over the second barrier layer.

24. The method of claim 22, further comprising depositing a bulk layer over the metal seed layer to fill the vias free of voids with a bulk material.

* * * * *